United States Patent [19] [11] Patent Number: 5,910,694
Yokozawa et al. [45] Date of Patent: Jun. 8, 1999

[54] ELECTRONIC COMPONENT COOLING APPARATUS

[75] Inventors: Shinjiro Yokozawa, Tokyo; Nobumasa Kodama, Ueda; Toshiki Ogawara, Toubumachi; Yuichi Kodaira; Michinori Watanabe, both of Ueda, all of Japan

[73] Assignee: Sanyo Denki Co., Ltd., Tokyo, Japan

[21] Appl. No.: 09/154,920

[22] Filed: Sep. 17, 1998

Related U.S. Application Data

[62] Division of application No. 08/672,375, May 29, 1996, Pat. No. 5,810,554.

[30] Foreign Application Priority Data

May 31, 1995 [JP] Japan .................................. 7-134392

[51] Int. Cl.⁶ .................................................. H02K 5/00
[52] U.S. Cl. .......................... 310/89; 310/58; 310/59; 310/61; 310/62; 310/63; 310/64; 310/67 R; 310/68 R; 415/175; 415/176; 361/697
[58] Field of Search ......................... 310/58, 59, 61, 310/62, 63, 89, 90; 415/175, 176, 178, 213.1, 214.1; 361/697, 80; 165/803

[56] References Cited

U.S. PATENT DOCUMENTS

| 4,164,690 | 8/1979 | Muller et al. ........................... 310/254 |
| 4,513,812 | 4/1985 | Papst et al. ............................ 165/80.3 |
| 4,904,891 | 2/1990 | Baker et al. ............................ 310/62 |
| 4,959,571 | 9/1990 | Yasumoto et al. ...................... 310/67 R |
| 5,288,203 | 2/1994 | Thomas .................................. 165/80.3 |
| 5,296,796 | 3/1994 | Havens et al. .......................... 318/808 |
| 5,309,983 | 5/1994 | Bailey .................................... 165/80.3 |
| 5,379,999 | 1/1995 | Barzideh et al. ....................... 271/264 |
| 5,445,215 | 8/1995 | Herbert .................................. 165/80.3 |
| 5,452,181 | 9/1995 | Hoover ................................... 361/697 |
| 5,484,013 | 1/1996 | Morikawa et al. ..................... 165/80.3 |
| 5,502,619 | 3/1996 | Wang ..................................... 361/697 |
| 5,504,650 | 4/1996 | Katzui et al. ........................... 361/687 |
| 5,526,875 | 6/1996 | Lin ......................................... 165/80.3 |
| 5,566,749 | 10/1996 | Jordan et al. ......................... 165/80.3 |
| 5,615,084 | 3/1997 | Anderson et al. ...................... 361/697 |
| 5,629,834 | 5/1997 | Kodama et al. ........................ 361/695 |

FOREIGN PATENT DOCUMENTS

| 251915 | 7/1985 | Japan ..................................... 361/687 |
| 253597 | 1/1989 | Japan ..................................... 361/687 |
| 231940 | 9/1990 | Japan ..................................... 361/687 |
| 231941 | 9/1990 | Japan ..................................... 361/687 |
| 15982 | 5/1991 | Japan ..................................... 361/687 |
| 111302 | 4/1995 | Japan ..................................... 361/687 |
| 321571 | 3/1996 | Japan ..................................... 361/687 |

*Primary Examiner*—Elvin G. Enad
*Attorney, Agent, or Firm*—Pearne, Gordon, McCoy & Granger LLP

[57] ABSTRACT

An electronic component cooling apparatus capable of permitting a sufficient amount of air to be fed to an electronic component to be cooled. An impeller which includes a plurality of blades for sucking air from one side in an axial direction of a revolving shaft of a motor is fixed on a rotor of the motor. A casing having a cylindrical cavity defined therein in which the motor and impeller are received is constructed of a peripheral wall arranged so as to surround the impeller and a closing wall for closing an end of the cavity on the other side in the axial direction. The peripheral wall is formed at a portion thereof in proximity to an end thereof on the one side with a lateral discharge port through which air suckedly introduced into the cavity is discharged so that a surrounding portion for surrounding a whole circumference of the impeller is left at a portion of the peripheral wall in proximity to an end on the other side. The casing is provided with a spacer means for providing an interval between the casing and an opposite member.

5 Claims, 9 Drawing Sheets

ELECTRONIC COMPONENT COOLING APPARATUS

CROSS REFERENCE TO RELATED APPLICATION

The present application is a division of U.S. patent application Ser. No. 08/672,375, filed on May 29, 1996, which issued as U.S. Pat. No. 5,810,554 on Sep. 22, 1998.

BACKGROUND OF THE INVENTION

This invention relates to an electronic component cooling apparatus, and more particularly to an electronic component cooling apparatus adapted to cool an electronic component while being received in a receiving housing of an electronic appliance.

Japanese Patent Application Laid-Open Publications Nos. 231940/1990 (2-231940) and 231941/1990 (2-231941) each disclose an air fan constructed so as to flow or feed air in a radial direction thereof perpendicular to an axial direction thereof by means of an axial fan. The air fan is generally called a radial fan in the art. An axial fan includes an impeller mounted on a revolving shaft of a motor. The impeller is provided with a plurality of blades and constructed so as to suck in air on one of both sides defined in an axial direction of a revolving shaft of the motor and guide it toward the other side. Also, the impeller is arranged in a cylindrical cavity which is defined in a casing by a peripheral wall of the casing. The axial fan exhibits characteristics capable of increasing the amount of air fed while keeping a pressure at a reduced level. The radial fan was developed utilizing such advantageous characteristics of the axial fan. Thus, the radial fan exhibits characteristics capable of increasing the amount of air fed while being reduced in thickness or depth thereof as compared with a cross-flow fan or a cirrocco fan and reducing noise as compared with a cirrocco fan.

The conventional radial fan described above is so constructed that a cavity in which an impeller is received is closed at one end thereof with a wall and provided with a lateral outlet or discharge port, which is formed by removing a part of a peripheral wall of a casing. The lateral discharge port is provided so as to thoroughly extend from one end of the cavity to the other end thereof, so that blades of the impeller each are fully exposed from the lateral discharge port of the casing when it faces the port during of the impeller.

U.S. Pat. Nos. 5,421,402, 5,452,181 and 5,484,013, Japanese Utility Model Publication No. 15982/1991 (3-15982), and Japanese Patent Application Laid-Open Publication No. 111302/1995 (corres. to U.S. Ser. No. 08/208,125) each disclose an electronic component cooling apparatus which is constructed so as to cool a heat sink mounted thereon with an electronic component such as a CPU or the like by means of an axial fan.

The inventors manufactured an electronic component cooling apparatus including the conventional radial fan constructed as described above utilizing the axial fan and made an experiment on the cooling apparatus thus manufactured. As a result, it was found that the radial fan causes the amount of air discharged from the lateral discharge port to be less than expected.

Also, when an electronic component cooling apparatus including the conventional radial fan is received in a receiving casing of an electronic appliance decreased in thickness or depth, it causes the amount of air fed to be excessively decreased or rendered substantially zero.

SUMMARY OF THE INVENTION

The present invention has been made in view of the foregoing disadvantage of the prior art.

Accordingly, it is an object of the present invention to provide an electronic component cooling apparatus which is capable of significantly increasing the amount of air fed.

It is another object of the present invention to provide an electronic component cooling apparatus which is capable of effectively feeding a sufficient amount of air even when it is arranged in a receiving casing of an electronic appliance decreased in thickness or depth.

It is another object of the present invention to provide an electronic component cooling apparatus which is capable of effectively cooling an electronic component even when a space in a receiving casing of an electronic appliance in which the electronic component cooling apparatus is arranged is reduced.

In accordance with the present invention, an electronic component cooling apparatus is provided. The electronic component cooling apparatus includes a motor including a rotor and a stator, an impeller securely mounted on the rotor and including a plurality of blades for sucking in air from one side in an axial direction of a revolving shaft of the motor, and a casing formed therein with a cavity in which the impeller is received. The casing includes a first wall arranged so as to surround the impeller to define the cavity, a second wall positioned on the other side in the axial direction of the revolving shaft based on the impeller and arranged opposite to the impeller, to thereby prevent air from flowing toward the other sides and at least one discharge port for discharging therethrough air which is sucked into the cavity and flows along the second wall.

The first wall includes a surrounding portion for surrounding a whole circumference of the impeller so as to restrain air circulation which causes a large part of air discharged from the discharge port to be suckedly returned through an open end of the cavity defined on the one side to the cavity.

The discharge port may be only one lateral discharge port formed in any radial direction of the revolving shaft. Alternatively, a plurality of discharge ports may be arranged in a radial direction of the revolving shaft. Also, the discharge port may be arranged so as to extend over a whole circumference of the casing.

The second wall of the casing is positioned on the other side based on the impeller while being rendered opposite to the impeller, to thereby prevent flowing of air toward the other side. The second wall is typically made of the same material as that for the first wall and acts as a closing wall or bottom wall for constituting the casing in cooperation with the first wall. Such construction permits an electronic appliance which is to be cooled to be arranged in juxtaposition to the cooling apparatus. Such arrangement results in air being blown directly against at least one electronic component juxtaposed to the cooling apparatus or a heat sink arranged with respect to the electronic component. This permits the electronic component to be effectively cooled even when the cooling apparatus is received in a receiving housing of an electronic appliance decreased in thickness or depth. The second wall of the casing may be a heat sink of increased heat conduction mounted on an electronic appliance. The heat sink is preferably provided thereon with a plurality of radiation fins. In this instance, the electronic appliance is cooled indirectly through the second wall. Alternatively, the second wall of the casing may be a wall to be cooled (hereinafter also referred to as "cooled wall") of an electronic appliance. This results in the cooled wall being directly cooled by air guided along the second wall.

In order to increase cooling efficiency, it is essential to prevent "air circulation" which causes a large part of air discharged from the discharge port from being suckedly returned through the above-described open end of the cavity on the one side to the cavity. The inventors made various experiments and as a result, it was found that the reasons why the conventional air fan described above fails to satisfactory feed air are that the discharge port is arranged so as to extend over one end of the cavity to the other end thereof, resulting in each of the blades of the impeller being exposed through the discharge port when it faces the port. Such full exposure of the blade through the discharge port causes the above-described air circulation. The air circulation causes suction of fresh ambient air into the cavity to be decreased in an amount corresponding to air returned due to the air circulation. In order to avoid such a problem, the present invention is so constructed that the surrounding portion remains on the casing, to thereby minimize the air circulation. Ideally, it is preferable that the lateral discharge port is provided to fully prevent the air circulation. In this connection, the above-described object of the present invention can be accomplished by reducing the air circulation.

When the electronic component cooling apparatus to which the present is applied includes a peripheral wall including the cylindrical wall in which the impeller is received, the peripheral wall including the cylindrical wall may be provided at a portion thereof in proximity to an end thereof on the other side in an axial direction of the revolving shaft with at least one lateral discharge port through which air suckedly introduced into the cavity is discharged in the radial direction of the revolving shaft. The peripheral wall may include a frame of a rectangular shape arranged outside the cylindrical wall. In this instance, a part of the cylindrical wall may constitute a part of the frame.

The blades of the impeller are preferably constructed so as to permit air sucked to be guided in a radial direction of the impeller to the utmost. An impeller for an axial fan which is adapted to guide air in an axial direction thereof may permit it to be guided also in a radial direction thereof due to centrifugal force. Nevertheless, the impeller is preferably designed or constructed so as to permit air to be guided in the radial direction to the utmost. The impeller thus constructed significantly increases the amount of air fed as compared with an impeller including a conventional axial fan.

Relationship in fundamental configuration, dimension, mounting and the like between the impeller and the casing may be established as in the conventional air fan. However, it was found that when the cooling apparatus of the present invention constructed utilizing such relationship between the impeller and the casing as conventionally established is arranged in a receiving housing of an electronic appliance, it fails to feed a sufficient amount of air. More particularly, when a distance between an end surface of the cooling apparatus on the one side in the axial direction (the open end of the cavity on the one side or a suction side) and an inner surface of the receiving housing or a member such as a circuit board or the like received in the receiving housing in a manner to be opposite thereto (hereinafter referred to as "opposite member") is reduced to a certain degree, the cooling fan substantially fails in air feeding. This causes a problem that design of an electronic appliance having the cooling apparatus of the present invention incorporated therein is rendered substantially difficult.

In view of the above, the present invention may be so constructed that the casing is provided on an end thereof on the one side with a spacer means extending in a direction apart from the casing. When the motor is received in the casing and a housing member of the motor is supported on an end of the first wall of the casing on the one side through a plurality of webs arranged on the casing so as to be spaced from each other at predetermined intervals in a circumferential direction thereof, the spacer means is arranged on the casing or housing member in the above-described manner, to thereby provide a space which permits air to be suckedly introduced into the cavity in the radial direction of the revolving shaft.

The spacer means may be constructed by extending a part of the first wall or peripheral wall of the casing or extending a part of the cylindrical wall on the one side in the axial direction. Alternatively, the spacer means may be arranged in any form other than the first wall or peripheral wall on an end of the casing on the one side or an end surface thereof. In this instance, the spacer means may be formed integrally with the casing. Also, the spacer means may be constituted by either legs of the above-described webs for supporting the housing member of the motor or the housing member.

The spacer means is formed into a length in the axial direction such that when the opposite member is arranged on an end of the spacer means on the one side or an end surface thereof in a manner to be substantially opposite to the cavity, a suction pressure sufficient to permit air to be suckedly introduced into the cavity in the radial direction of the revolving shaft may be established. The dimension thus determined results in a pressure different sufficient to permit air to flow in a space defined by the spacer means being generated when the impeller is rotated. Arrangement of such a spacer means permits the cooling apparatus of the present invention to be incorporated in any electronic appliance irrespective of a thickness or depth of the appliance.

The casing may be formed into any suitable outer configuration. When the spacer means is formed separately from the casing while configuring the latter into a rectangular shape, the spacer means may be constituted by four pillars respectively arranged on corners of the casing. The pillars effectively provide a space required. When the pillars each are formed with a through-hole, mounting of the cooling apparatus is facilitated and it is not required to provide the casing with a space for spacer means, resulting in the casing being rendered compact.

When the second wall of the casing is constituted by the cooled wall of the electronic appliance, a third wall of the casing opposite to the cooled wall through a gap may be arranged so as to be opposite to a substantially whole surface the cooled wall while being increased in area.

The cooling apparatus of the present invention may be received in the receiving housing of the electronic appliance in any manner. When the spacer means is not provided on the casing, the cooling apparatus is housed in the receiving housing so that a space sufficient to establish the above-described suction pressure may be provided between the open end of the cavity of the casing on the one side and the opposite member.

When the spacer means is provided on the casing, the cooling apparatus is arranged in the receiving housing in such a manner that the spacer means is abutted against an inner surface of the receiving housing or a surface of a circuit board arranged in the receiving housing.

Alternatively, the cooling apparatus may be so arranged that a duct is formed between the opposite member and the cooled wall or second wall. In this instance, the impeller positively agitates air in the duct to cool the cooled wall.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, an electronic component cooling apparatus according to the present invention will be described hereinafter with reference to the accompanying drawings.

Figure 1:
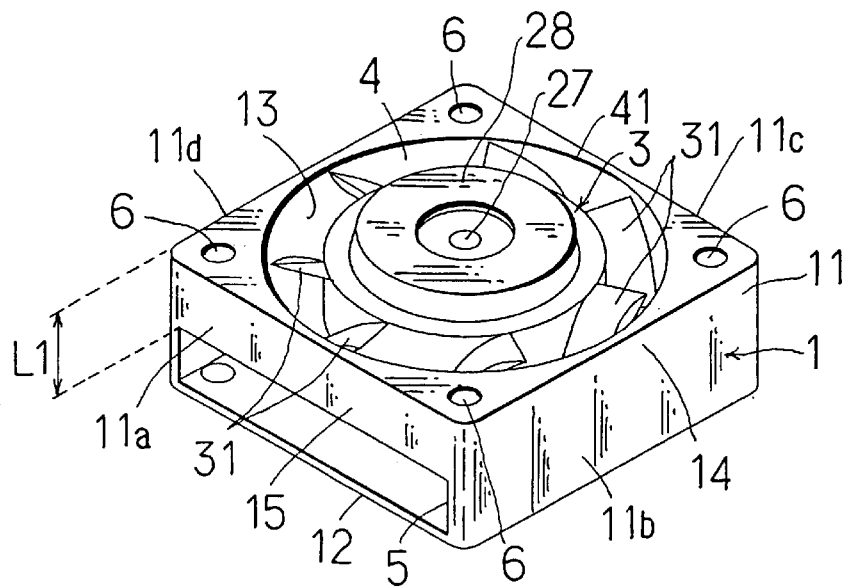
FIG. 1 is a perspective view showing an embodiment of an electronic component cooling apparatus according to the present invention.
Figure 2:
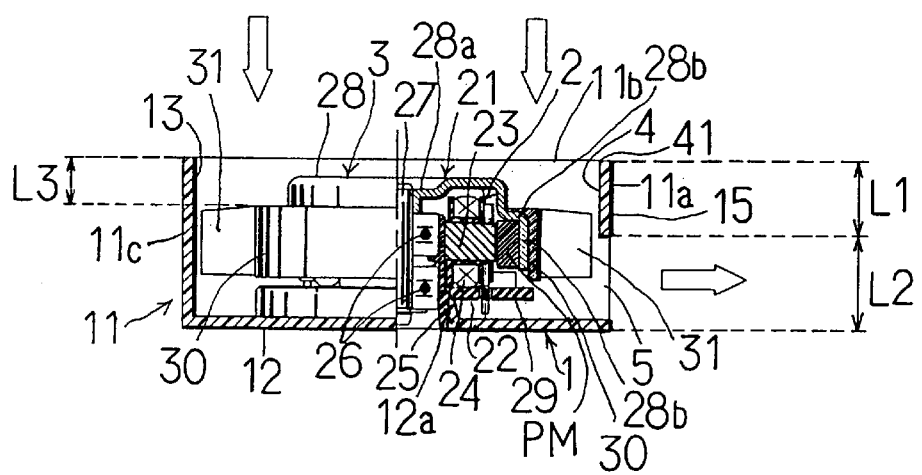
FIG. 2 is a sectional view of the electronic component cooling apparatus shown in FIG. 1.

Referring first to FIGS. 1 and 2, an embodiment of an electronic component cooling apparatus according to the present invention is illustrated. In FIG. 2, arrows indicate a direction of flow of air. In FIGS. 1 and 2, reference numeral 1 designates a casing which will be detailedly described hereinafter, and 2 is a motor including a rotor 21 and a stator 22. A two-phase DC brushless motor may be used as the motor 2. The stator 22 of the motor 2, as shown in FIG. 2, includes an iron core 23 and an exciting coil 24 wound on the core 23 and is mounted on a cylindrical boss section 12a provided on a closing wall 12 of the casing 1. The boss section 12a has a bearing holder 25 fitted therein, in which a pair of bearings 26 are arranged in a manner to be spaced from each other at a predetermined interval. Reference numeral 27 designates a revolving shaft of the motor 2 which is rotatably supported at one end thereof on the bearings 26 and fitted at the other end thereof in a hole formed at a bottom wall 28a of a cup-like member 28. The bearing holder 25 is mounted thereon with a circuit board 29 on which electronic components constituting a drive circuit are mounted. The cup-lie member 28 also includes a peripheral wall 28b, which is mounted on an inner peripheral surface thereof with a plurality of magnetic poles each provided by a permanent magnet PM. The rotor 21 is constructed of the rotor 21, revolving shaft 27, cup-like member 28 and permanent magnets PM.

Reference numeral 3 designates an impeller which is securely mounted on the rotor 21 and includes a plurality of blades 31 arranged so as to permit air to be sucked in from one side (suction side) of an axial direction of the revolving shaft 27 of the motor 2 and then guided mainly toward the other side (discharge side) of the axial direction. The impeller 3 also includes a ring section 30 fitted on the peripheral wall section 28b of the cup-like member 28 of the rotor 21, on which the blades 31 are integrally provided. The blades 31 of the impeller 3 each are so configured and orientated that air sucked may be guided or fed in a radial direction of the revolving shaft 27 to the utmost.

Now, the casing 1 will be described more detailedly. The casing 1 is integrally formed of a synthetic resin material such as polybutylene terephthalate or the like. The casing 1 is formed therein with a cylindrical cavity 4, in which the motor 2 and impeller 3 are arranged. For this purpose, the casing 1 includes a peripheral wall 11 by which the cavity 4 is defined. Also, the casing 1 includes a closing wall 12 for closing an end of the cavity defined on the discharge side in the axial direction of the revolving shaft 27. Thus, in the illustrated embodiment, the peripheral wall 11 acts as a first wall for surrounding the impeller 3 and the closing wall 12 constitutes a second wall for blocking flow of air toward the discharge side.

The peripheral wall 11 is formed of four side wall sections 11a to 11d into a substantially rectangular outer configuration as viewed in the axial direction. In the illustrated embodiment, the four side wall sections 11a to 11d are so formed and arranged that the peripheral wall 11 constructed of the side wall sections provides a cylindrical inner surface 13 for surrounding the impeller and a rectangular outer surface or frame 14. In the illustrated embodiment, a part of the cylindrical inner surface 13 acts as a part of the outer surface or frame 14. One of the side wall sections 11a to 11d or the side wall 11a is formed at a portion thereof positioned on the discharge side with a lateral discharge port 5 which permits air introduced from an open end 41 of the cavity 4 formed on the suction side into the cavity 4 to be laterally discharged therethrough in the radial direction of the revolving shaft 27. The lateral discharge port 5 is so formed that each of the blades 31 is partially exposed through the port 5 when it faces the port 5 during rotation of the impeller.

In the illustrated embodiment, the lateral discharge port 5 is formed and dimensioned so as to prevent air circulation which causes a large part of air discharged from the lateral discharge port 5 to be suckedly returned to the cavity 4 through the open end 41 of cavity 4 immediately after the discharge. This permits the amount of air discharged from the lateral discharge port 5 to be increased. More specifically, a length L of the side wall 11a which is a dimension thereof in the axial direction of the revolving shaft 27 is defined so as to prevent each of the blades 31 from being fully exposed through the lateral discharge port 5 when it is rendered opposite to the port 5 during rotation of the impeller. The length L1 is determined depending on a size of the electronic component cooling apparatus or air fan and a capacity thereof. When the air fan has a size of 40 mm×40 mm×16 mm (thickness) and is rotated at a speed of 5,000 rpm, the dimension L1 is preferably about 5 mm or more. Also, a length L2 of the lateral discharge port 5 which is a dimension thereof in the axial direction of the revolving shaft 27 is preferably set so that a dimension of each of the blades 31 in the axial direction which is exposed therethrough is about 3 mm.

Also, in the illustrated embodiment, the dimension L1 of the peripheral wall 11 may be determined so that even when the open end 41 of the cavity 4 is closed with an air-permeable member such as a net plate, a perforated plate or the like, a length or axial dimension L3 of a portion of the peripheral wall 11 defined between an end of the blade 31 on the suction side and the open end 41 of the cavity 4 on the suction side may provide a suction pressure sufficient to permit a sufficient amount of air to be introduced into the cavity 4. The dimension L1 thus determined permits a pressure difference which is sufficient to permit air to flow in a portion of the cavity between the end of the blade 31 on the suction side and the open end 41 of the cavity 4 to be formed therein. The dimension L1 ensures that even when the apparatus of the illustrated embodiment is arranged in a receiving housing of an electronic appliance while keeping the open end 41 of the cavity 4 closely contacted with a wall of the receiving housing, air is smoothly introduced into the receiving housing so long as the receiving housing is provided with any suitable ventilation means such as a net or perforations. When the apparatus is arranged in the electronic appliance while keeping the open end 41 of the cavity 4 free, it is not required to provide the dimension L3 in the above-described manner.

Supposing that the amount of air fed in the axial direction by a conventional axial fan is 1, that in the radial direction by the cooling apparatus of the illustrated embodiment is as small as about 0.33. For comparison, the amount of air fed by a conventional cirrocco fan intended to feed air in the radial direction is about 0.2 and, in order to provide the air feed quantity, the cirrocco fan requires electric power increased by 15% or more as compared with the cooling apparatus or air fan of the illustrated embodiment.

In FIG. 1, reference numeral 6 designates through-holes formed at corners of the casing 1, via which mounting screws are inserted.

Figure 3:
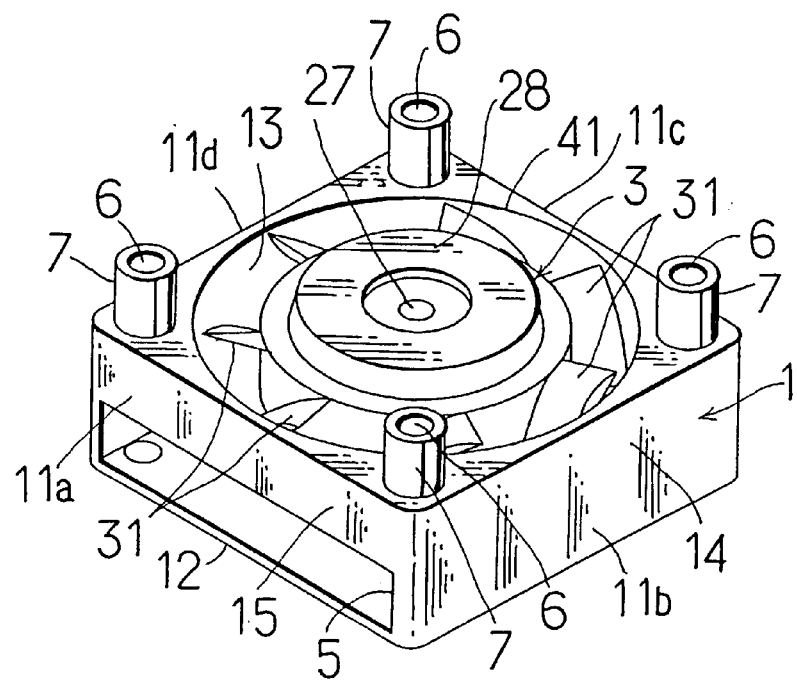
FIG. 3 is a perspective view showing another embodiment of an electronic component cooling apparatus according to the present invention.
Figure 4:
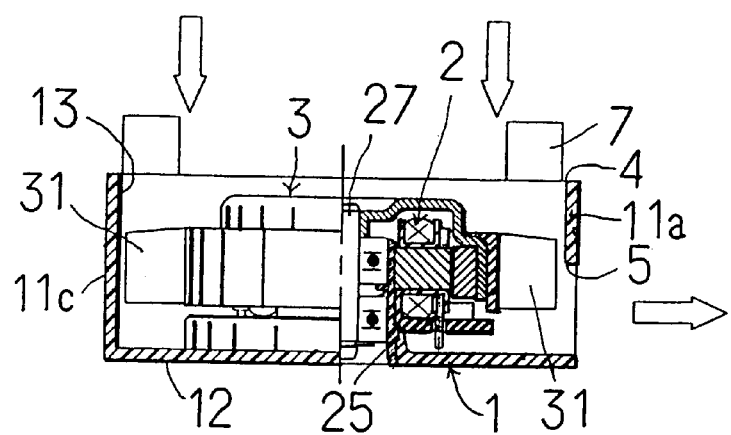
FIG. 4 is a sectional view of the electronic component cooling apparatus shown in FIG. 3.

Referring now to FIGS. 3 and 4, another embodiment of an electronic component cooling apparatus according to the present invention is illustrated. An electronic component cooling apparatus of the illustrated embodiment may be constructed in substantially the same manner as the above-described embodiment, except that a casing 1 is provided on an end thereof or an end surface thereof defined on an air suction side thereof with a spacer means in a manner to extend outwardly from the air suction side or in a direction apart from the casing 1. In FIGS. 3 and 4, reference characters like those in FIGS. 1 and 2 designate corresponding parts. The apparatus of the illustrated embodiment is constructed so as to be arranged in a receiving housing of a reduced thickness or depth of an electronic appliance such as a microcomputer or the like. A decrease in depth of the receiving housing causes a distance between one end surface of the apparatus or air fan or an open end 41 of a cavity 4 and an inner surface of the receiving housing or an opposite member such as a circuit board or the like received in the receiving housing to be reduced. An excessive reduction of the distance causes the air fan to fail in satisfactory air feeding. The fan is adapted to form a region of a reduced air pressure due to rotation of blades, to thereby flow air from a high pressure region to the reduced pressure region. In this instance, it would be considered that a decrease in distance between the fan and the opposite member fails to distinctly separate the high pressure region and reduced pressure region from each other, resulting in failing to establish satisfactory air flow. More particularly, the opposite member acts as a barrier between the high pressure region and the reduced pressure region (a central portion of an impeller), to thereby block movement of air. Unfortunately, a user of such a cooling apparatus is hard to understand a suitable degree of such a distance. In order to solve the problem, in the illustrated embodiment, the casing 1 is provided on the end thereof on the suction side thereof with a spacer means or four projections 7 in the form of a pillar in a manner to outwardly extend from the casing 1. The projections or pillars 7 are formed so as to be integral with the casing 1 and each are provided with a through-hole 6 via which a screw is inserted, to thereby facilitate mounting of the cooling apparatus.

The pillars 7 each are formed into such a length or a dimension in an axial direction thereof that a suction pressure sufficient to permit an adequate amount of air to be suckedly introduced into a cavity may be established in the cavity even when any member is arranged on the pillars 7 so as to be substantially or entirely opposite to the cavity 4. Such a length of the pillars 7 ensures that a pressure difference sufficient to permit air to flow in a space defined by cooperation of the pillars 7 with each other is established in the space. Such arrangement of the spacer means or pillars 7 results in the pillars 7 providing a space needed for establishing a required suction pressure irrespective of a depth or thickness of the receiving housing of the electronic appliance when the apparatus or air fan of the illustrated embodiment is received or arranged in the receiving housing, so that the air fan may be effectively arranged in any receiving housing without being deteriorated in function.

A receiving housing of a microcomputer of the notebook type which is commercially available tends to be further decreased in depth or thickness. Thus, it is estimated that it will be demanded to reduce a thickness of a cooling apparatus received in the receiving housing to a level as small as 20 mm or less. However, the conventional cross-flow fan or cirrocco fan substantially fails to provide an air flow quantity of a satisfactory level when it is reduced in thickness. It will be noted that the cooling apparatus of the present invention effectively solves such a problem as encountered with the prior art.

Figure 5:
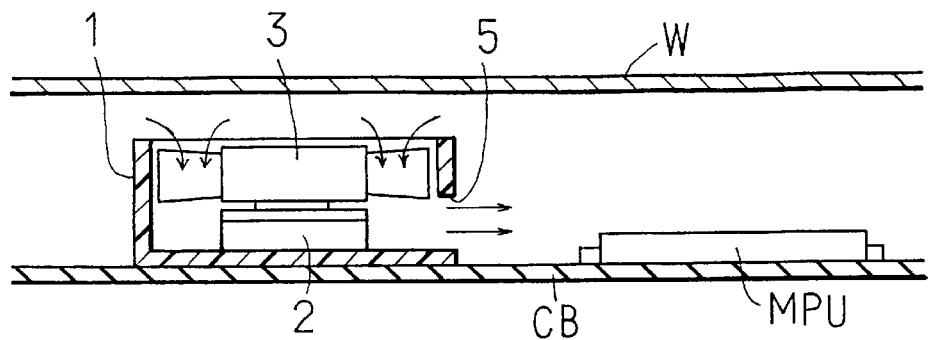
FIG. 5 is a schematic sectional view showing arrangement of the electronic component cooling apparatus shown in FIG. 1 for cooling an electronic component received in a receiving casing of an electronic appliance.

Referring now to FIG. 5, an example of arrangement of the cooling apparatus of FIGS. 1 and 2 in a receiving housing of a microcomputer (electronic appliance) of the notebook type is illustrated. In FIG. 5, reference character W designates a wall of the receiving housing of the electronic appliance and MPU is a microprocessor mounted directly on a circuit board CB. In the example, the cooling apparatus is mounted on the circuit board CB in a manner to be adjacent to the microprocessor MPU. Also, the cooling apparatus is arranged on the circuit board CB while putting the closing wall of the casing 1 on the circuit board CB. Such arrangement of the cooling apparatus permits the microprocessor MPU to be directly cooled.

Figure 6:
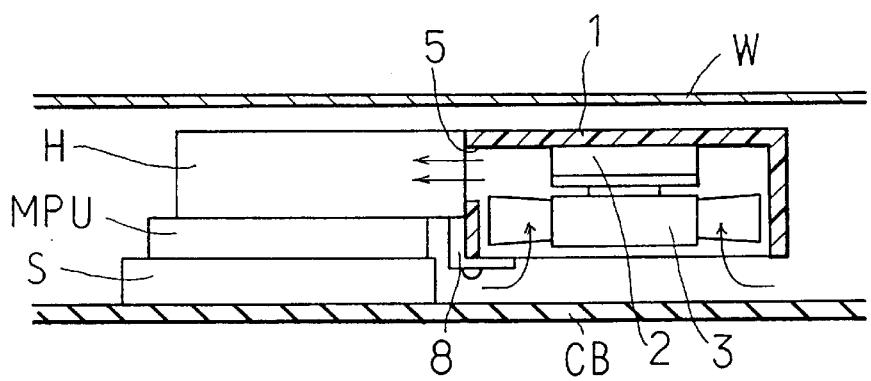
FIG. 6 is a schematic sectional view showing arrangement of the electronic component cooling apparatus shown in FIG. 1 for cooling a microprocessor unit.

Referring now to FIG. 6, another example of arrangement of the electronic component cooling apparatus of FIGS. 1 and 2 is illustrated, wherein the electronic component cooling apparatus is securely arranged on a heat sink H for cooling a microprocessor MPU. In FIG. 6, reference character S designates a socket for mounting the microprocessor MPU. The cooling apparatus is securely mounted on a bracket 8 by means of screws inserted via the through-holes 6 of the casing 1. The bracket 8 is attached to the heat sink H. In the example, the lateral discharge part 5 is formed so as to face the heat sink H for cooling the microprocessor MPU. Such arrangement of the cooling apparatus permits the microprocessor MPU to be cooled indirectly through the heat sink H directly cooled.

Figure 7:
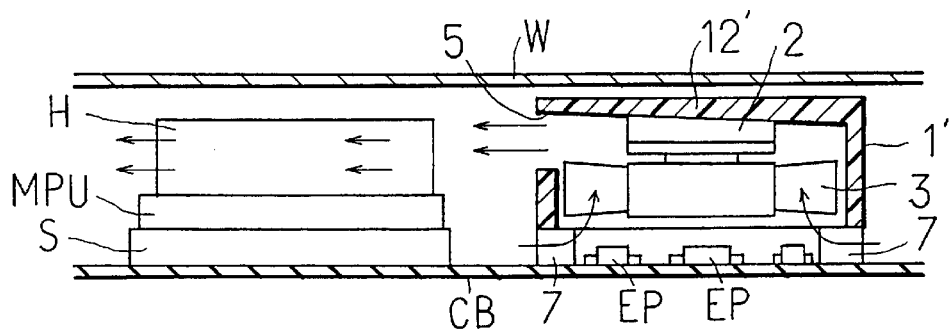
FIG. 7 is a schematic sectional view showing arrangement of the electronic component cooling apparatus shown in FIG. 3 for cooling a microprocessor unit.

Referring now to FIG. 7, a modification of the electronic component cooling apparatus of FIGS. 3 and 4 is illustrated, which is adapted to cool a microprocessor MPU. An electronic component cooling apparatus of the modification is so constructed that an inner surface of a closing wall 12' of a casing 1' is gradually inclined toward a lateral discharge port 5 so as to cause a cavity in the casing 1' to be enlarged toward the lateral discharge port 5. This may be accomplished, for example, by reducing a thickness of the closing wall 12' toward the discharge port 5. Such construction permits air striking on the closing wall 12' to be smoothly guided toward the lateral discharge port 5. Also, in the illustrated modification, the cooling apparatus or air fan is mounted on a circuit board CB while keeping pillars 7 or a spacer means abutted against a circuit board CB. The circuit board CB is provided on a portion thereof opposite to the air fan with an electronic component EP such as a transistor or the like. Such construction of the illustrated embodiment permits operation of the cooling apparatus to accomplish concurrent cooling of both electronic component EP and heat sink H. The remaining part of the modification may be constructed in substantially the same manner as the embodiment of FIGS. 3 and 4.

Figure 8:
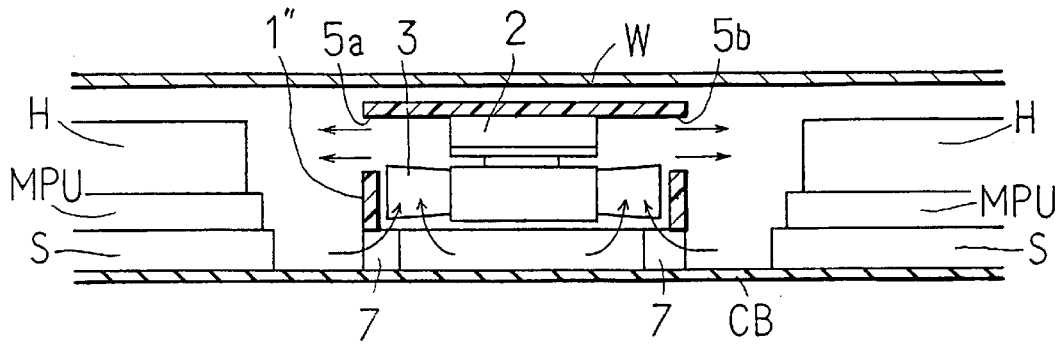
FIG. 8 is a schematic sectional view showing arrangement of the electronic component cooling apparatus shown in FIG. 3 for cooling a microprocessor unit.

Referring now to FIG. 8, another modification of the electronic component cooling apparatus of FIGS. 3 and 4 is illustrated, which is likewise adapted to cool a microprocessor MPU. An electronic component cooling apparatus or air fan of the illustrated modification is so constructed that a casing 1" is provided with two lateral discharge ports 5a and 5b, which are arranged so as to face two heat sinks H for cooling two microprocessors MPU arranged on a circuit board CB, respectively. Such arrangement of the two lateral discharge ports 5a and 5b at the casing 1" permits concurrent cooling of two or more electronic parts or components. The remaining part of the modification may be constructed in substantially the same manner as the embodiment of FIGS. 3 and 4.

In each of FIGS. 5 to 8, the electronic component cooling apparatus or air fan is mounted on the circuit board CB. Alternatively, the air fan may be mounted on the wall W of the receiving housing of the electronic appliance.

Also, in each of FIGS. 5 to 8, the cooling apparatus is adapted to feed air directly to the electronic component in the receiving housing. Alternatively, it may be arranged outside the receiving housing so as to outwardly discharge air in the receiving housing therefrom or introduce ambient air into the receiving housing.

The electronic component cooling apparatuses described above each are so constructed that the casing is provided on the portion thereof in proximity to the end thereof on the one side of the axial direction of the revolving shaft with at least one lateral discharge port so that the surrounding portion of the casing for circumferentially surrounding the impeller is left on the other side of the axial direction. Such construction permits the surrounding portion to prevent air discharged from the lateral discharge port from being suckedly returned to the cavity of the casing through the open end of the casing. Thus, it permits a sufficient amount of air to be fed to the cavity while effectively preventing the air circulation.

Further, arrangement of the spacer means on the casing permits the spacer means to effectively provide a space required for establishing a suction pressure required even when the air fan is arranged in a receiving housing of an electronic component which is reduced in thickness or depth, resulting in ensuring positive feeding of air to the casing.

Figure 9:
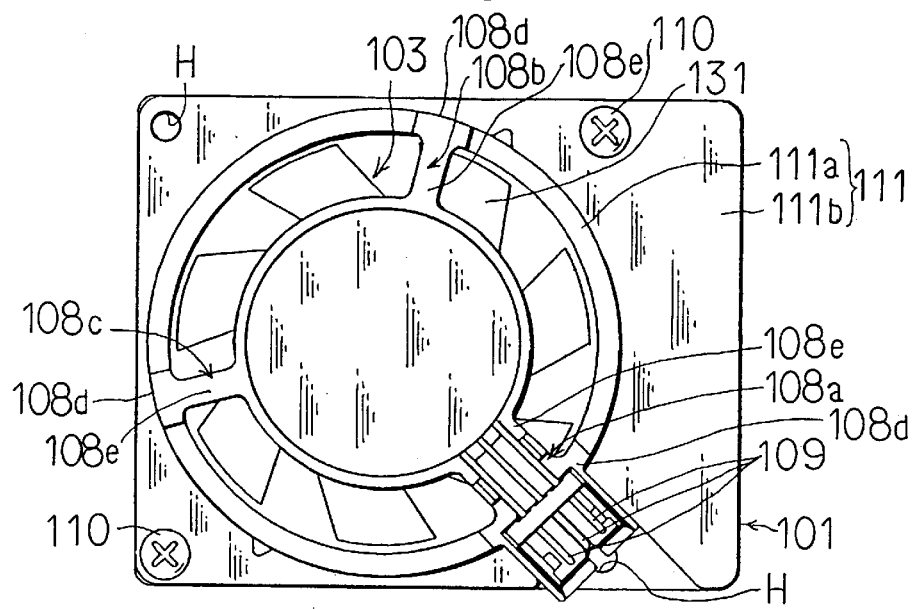
FIG. 9 is a plan view showing a further embodiment of an electronic component cooling apparatus according to the present invention.
Figure 10:
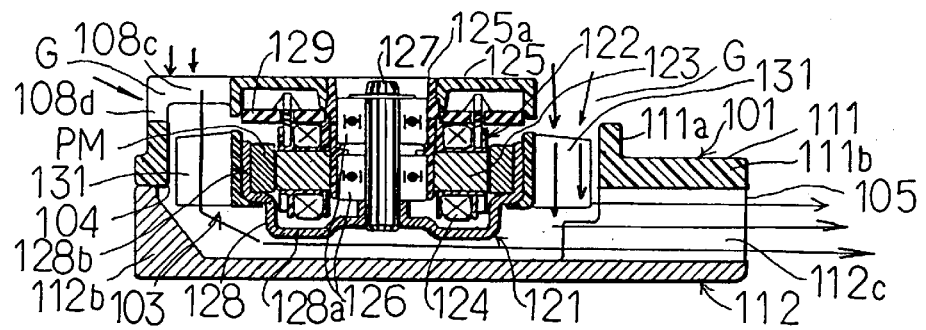
FIG. 10 is a sectional view of the electronic component cooling apparatus shown in FIG. 9.
Figure 11:
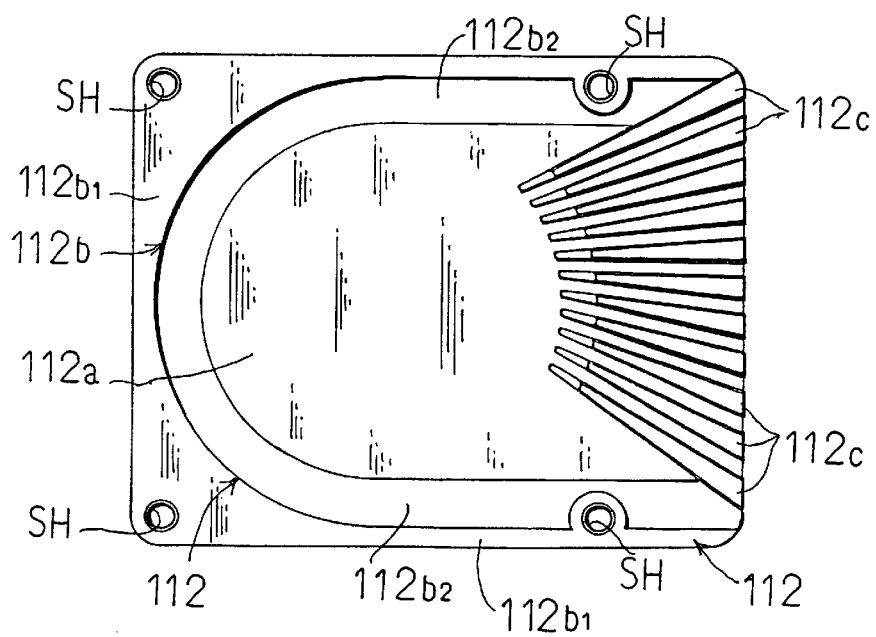
FIG. 11 is a plan view showing a heat sink used in the electronic component cooling apparatus of FIG. 9.

Referring now to FIGS. 9 to 11, a further embodiment of an electronic component cooling apparatus according to the present invention is illustrated. In an apparatus or air fan of the illustrated embodiment, a structure for mounting a motor, a casing and a spacer means are constructed in a manner substantially different from those of the cooling apparatus shown in FIGS. 1 and 2 or FIGS. 3 and 4.

In FIG. 10, reference numeral 101 designates a casing and 102 is a two-phase DC brushless DC motor including a rotor 121 and a stator 122. Reference numeral 123 is an iron core, 124 is an exciting coil, 125 is a housing member provided with a bearing holder 125a, and 126 is a pair of bearings arranged so as to be spaced from each other at a predetermined interval in an axial direction of a revolving shaft 127 of the motor 102. The revolving shaft 127 is fitted at one end thereof in a hole formed at a bottom wall 128a of a cup-like member 128. The housing member 125 is securely mounted thereon with a circuit board 129 on which electronic components for forming a drive circuit are arranged. The cup-like member 128 includes a peripheral wall 128b which is securely mounted on an inner surface thereof with a plurality of permanent magnets PM each providing a magnetic pole. The revolving shaft 127, cup-like member 128 and permanent magnets PM cooperate with each other to provide the rotor 121.

Reference numeral 103 designates an impeller securely mounted on the rotor 121 and includes a plurality of blades 131 for sucking in air on one side in the axial direction of the revolving shaft 127 or a suction side. The impeller 103 also includes a ring section 130 formed integrally with the blades 131 and fitted in the peripheral wall 128b of the cup-like member 123 of the rotor 121. The housing 125 of the motor 101 is mounted on the casing 101 through three webs 108a to 108c arranged on the casing 101 so as to be spaced from each other at angular intervals of 120 degrees in a peripheral direction thereof. The web 108a is provided thereon with a connector conductor 109 to which a cord is connected. The webs 108a to 108c each include a leg section 108d formed so as to extend in parallel to the axial direction and a connection section 108e formed so as to extend in a radial direction.

Now, the casing 101 will be more detailedly described hereinafter.

The casing 101 generally includes a first casing half 111 and a second casing half 112 each made of a synthetic resin material such as polybutylene terephthalate or the like. The first casing half 111 is formed integrally with the housing member 125 and webs 108a to 108c and the second casing half 112 is constructed of a heat sink 112. The first casing half 111 includes a cylindrical wall 111a arranged so as to surround the impeller 103 and define a part of a cavity 104 in which the impeller 103 is received, as well as a flange section 111b arranged so as to extend from a proximal portion of the cylindrical wall 111a in a direction perpendicular to the cylindrical wall. The cylindrical wall 111a corresponds to a surrounding portion constituting a part of a first wall defining the cavity 104. The cylindrical section 111a is fixedly mounted on an end thereof on the suction side with the leg section 108d of each of the webs 108a to 108c which are fixed at one end thereof on the housing member 125. In the illustrated embodiment, at least one of the leg sections 108d, connection sections 108e and housing member 125 constitutes a spacer means.

A length or dimension of the leg section 108d extending in the axial direction is determined so as to establish a suction pressure sufficient to permit a sufficient amount of air to be suckedly introduced into the cavity 104 from a space or gap G defined between the two legs 108d when an opposite member is arranged on the connection sections 108e and housing member 125 in a manner to entirely or substantially face the cavity 104. Thus, the dimension is determined so as to generate a pressure difference which causes air to be suckedly introduced into the space G when the impeller 103 is rotated.

The flange section 111b is formed at a portion thereof positionally corresponding to a lateral discharge port 105 into an increased length as compared with the remaining portion. The flange section 111b is formed with four through-holes H. Of the four through-holes H, any two diagonally opposite to each other each have a screw 110 threadedly inserted therethrough, so that the first casing half 111 may be screwed on the heat sink 113 (second casing half 9).

The heat sink 112, as shown in FIG. 11, includes a base 112a for providing a second wall opposite to the impeller 103, a U-shaped rib 112b integrally provided on the base 112a so as to extend three sides of the base 112a and a plurality of radiation fins 112c arranged in correspondence to one side of the base 112a on which the rib 112b is not arranged. The base 112a is formed into substantially the same outer configuration as that of the flange section 111b of the first casing half 111. The rib 112b includes a flat portion 112b1 with which the flange section 111b of the first casing half 111 is contacted and an inclined portion obliquely extend from the flat portion 112b1 toward the base 112a. The inclined portion 112b2, as shown in FIG. 11, is formed into a U-shape. The radiation fins 112c are arranged so as to substantially radially extend from a side of a central portion of the base 112a toward one of short sides of the base 112a. Also, the radiation fins 112c are provided integrally with the base 112a so as to be perpendicular to the base 112a and formed so as to be increased in thickness toward the one short side of the base 112a. The rib 112b is formed with four threaded holes SH in a manner to be aligned with the through-holes H of the flange section 111b of the first casing half 111. The through-holes H and threaded holes SH into which the screws 110 are not inserted are used for mounting of the cooling apparatus.

In the illustrated embodiment thus constructed, air suckedly introduced into the cavity through an open end of the casing on a side of the webs 108a to 108c of the cavity 104, as shown in FIG. 10, is guided on a surface of a portion of the base 112a surrounded by the rib 112b and then between the radiation fins 112c and then discharged from the lateral discharge port 105. The base 112a of the heat sink 112 is mounted on a rear surface thereof with an electronic component such as a CPU, an MPU or the like by means of a holder.

In the illustrated embodiment, the spacer means 108d is provided; so that even when an opposite member such as a wall of a receiving housing of an electronic appliance or the like is arranged in proximity to the webs 108a to 108c and housing member 125, air may be discharged from the lateral discharge port 105, leading to cooling of the electronic component.

In the illustrated embodiment as well, a dimension of the cylindrical wall 111a in the axial direction, as well as a configuration of the lateral discharge port and a dimension thereof are determined so as to prevent air circulation which causes a large part of air discharged from the lateral discharge port 105 to be introduced from the open end of the cavity 104 (or the cylindrical wall 111a) into the cavity 104 immediately after the discharge, to thereby increase the amount of air discharged from the lateral discharge port.

In the illustrated embodiment, the revolving shaft 127 of the motor 102 is so arranged that an axis thereof is deviated from a center of the heat sink 112. More specifically, the axis is defined so as to be deviated from the center of the heat sink 112 to one of sides in a longitudinal direction of the heat sink 112 or deviated apart from the lateral discharge port 105. Such arrangement permits cooling by air discharged from the single lateral discharge port 105 to be carried out at increased efficiency.

Figure 12A:
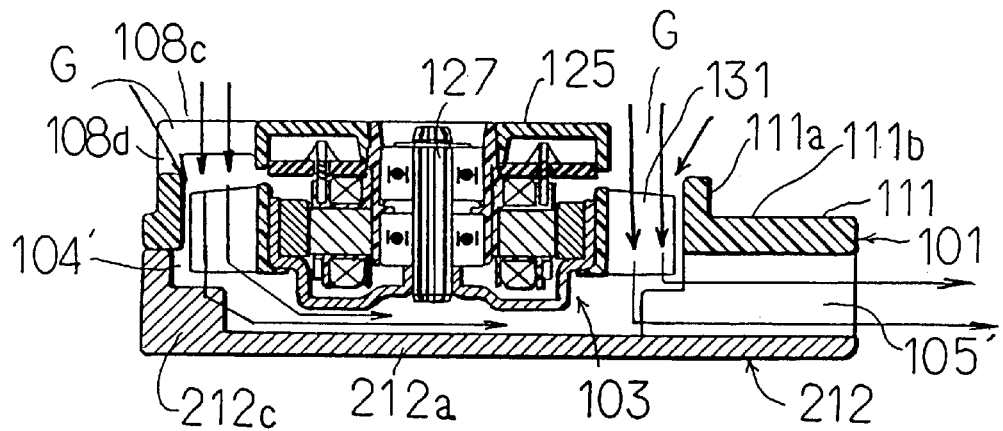
FIG. 12A is a sectional view showing still another embodiment of an electronic component cooling apparatus according to the present invention.
Figure 12B:
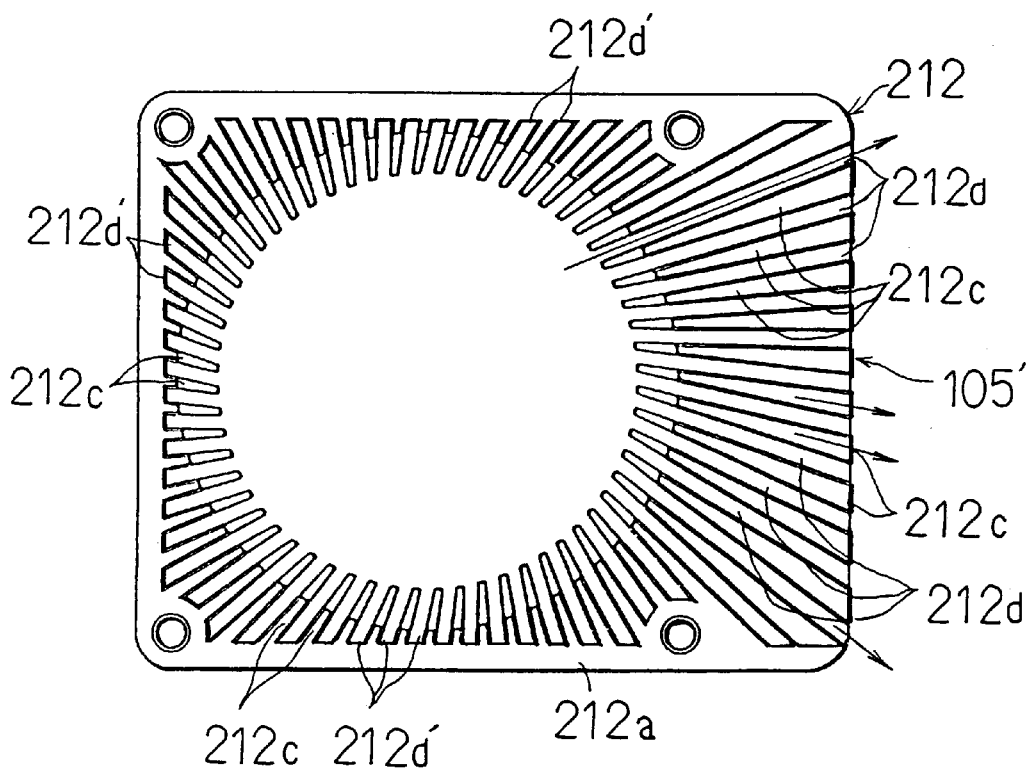
FIG. 12B is a plan view showing a heat sink used in the electronic component cooling apparatus of FIG. 12A.

Referring now to FIGS. 12A and 12B, a modification of the electronic component cooling apparatus or air fan shown in FIGS. 9 to 11 is illustrated. Parts in the modification shown in FIGS. 12A and 12B similar to those in the embodiment of FIGS. 9 to 11 are designated at reference characters represented by adding numeral "100" to reference characters used for indicating the corresponding parts in the embodiment. In the illustrated modification, a single lateral discharge port 105' is provided as in the embodiment of FIG. 9. The modification is different from the embodiment of FIG. 9 in that radiation fins 212c are arranged so as to surround a whole circumference of an impeller 103. Thus, the rib 112 used in the embodiment of FIG. 9 is excluded from the modification. A passage 212d for the radiation fins position on one side facing the lateral discharge port 105' is open on a side of the lateral discharge port 105' and a passage 212d' defined between the radiation fins 212c positioned on the remaining three sides is closed at an outer end thereof. The remaining part of the illustrated modification may be constructed in substantially the same manner as the embodiment of FIGS. 9 to 11.

In the illustrated modification, the heat sink 212 includes a base 212a which is integrally formed on a surface thereof with a plurality of radiation fins 212c so as to substantially surround a lower half of the impeller 103. A space surrounded by the radiation fins 212c constitutes a part of a cavity 104'. The illustrated modification is likewise provided with a spacer means 108d; so that even when an opposite member such as a wall of a receiving housing of an electronic appliance or the like is arranged in proximity to webs 108a to 108c and a housing member 125, air may be discharged from the lateral discharge ports 105', leading to cooling of the electronic component.

Figure 13A:
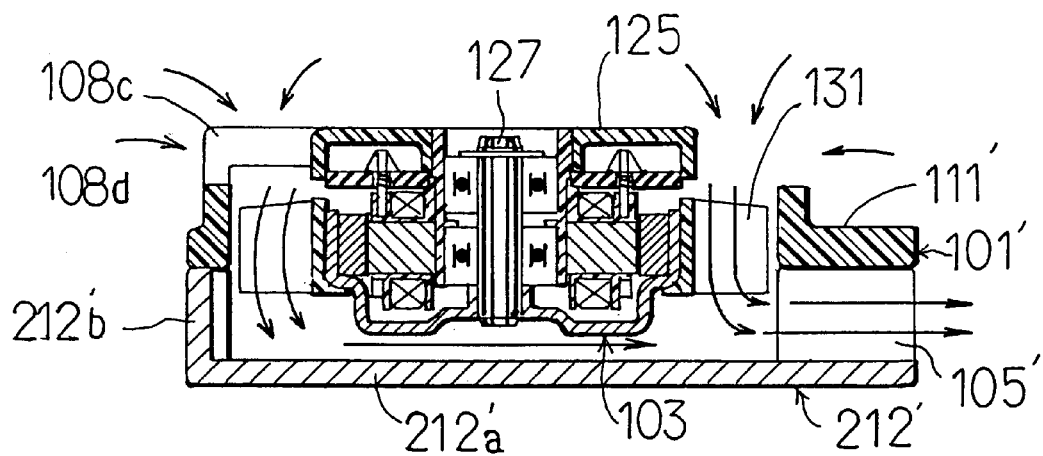
FIG. 13A is a sectional view showing a modification of the electronic component cooling apparatus shown in FIG. 9.
Figure 13B:
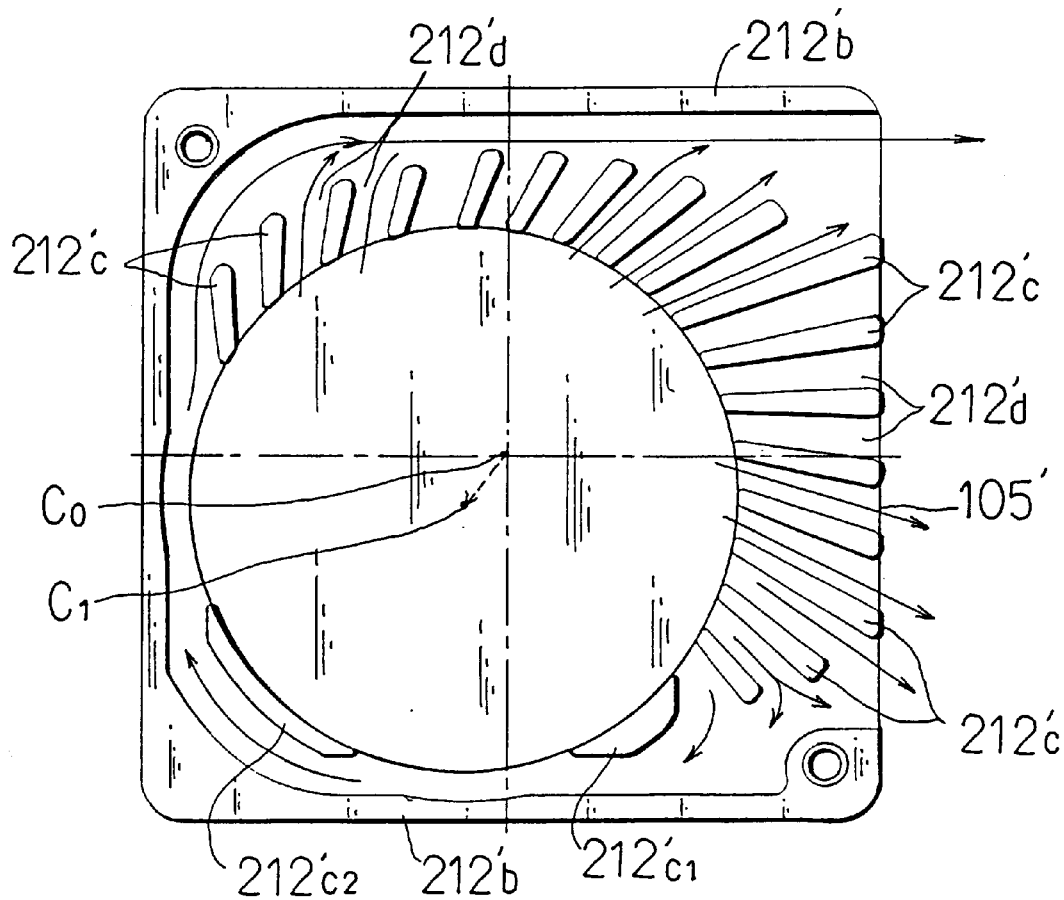
FIG. 13B is a plan view showing a heat sink used in the electronic component cooling apparatus shown in FIG. 13A.

Referring now to FIGS. 13A and 13B, another modification of the electronic component cooling apparatus shown in FIGS. 9 to 11 is illustrated, which is constructed of a combination of the apparatus of FIGS. 9 to 12 and that of FIGS. 12A and 12B. Parts in the modification shown in FIGS. 13A and 13B similar to those in the embodiment of FIGS. 9 to 11 are designated at reference characters represented by adding a dash (') to reference characters used for indicating the corresponding parts shown in FIG. 12. In the modification, a heat sink 212' and mounting of an impeller 103 are are different from those in FIGS. 9 to 12. The heat sink 212' is provided on an outer periphery thereof other than a portion thereof facing a lateral discharge port 105' with a rib 212'b in a manner to surround the impeller 103. Radiation fins 212'c are arranged along the lateral discharge port 105' and one side adjacent to the lateral discharge port. The radiation fins 212'c are formed so as to extend along a stream of air discharged from the impeller 103 when the impeller 103 is rotated in a clockwise direction. More particularly, a configuration of the radiation fins 212c' is determined so as not to exhibit increased resistance to an air stream discharged from the impeller 103. Also, the radiation fins 212'c1 and 212'c2 are formed into a configuration which permits air discharged from the impeller 103 to flow along an inner surface of the rib 212'b. In the modification, the impeller 103 is so arranged that a center C1 thereof (an axis of the revolving shaft 127) is deviated from a center C0 of the heat sink 212' to one corner of the heat sink 212' (a corner thereof positioned opposite to the lateral discharge port 105' and positioned in a direction opposite to a direction of rotation of the impeller 103). Such arrangement increases radiation efficiency as compared with FIG. 12.

Figure 14A:
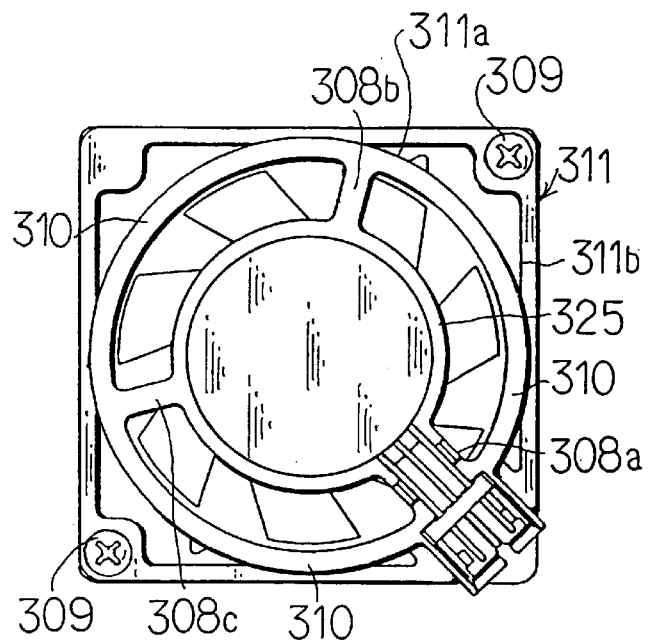
FIGS. 14A, 14B and 14C are a plan view, a side elevation view and a sectional view showing still another embodiment of an electronic component cooling apparatus according to the present invention.
Figure 14B:
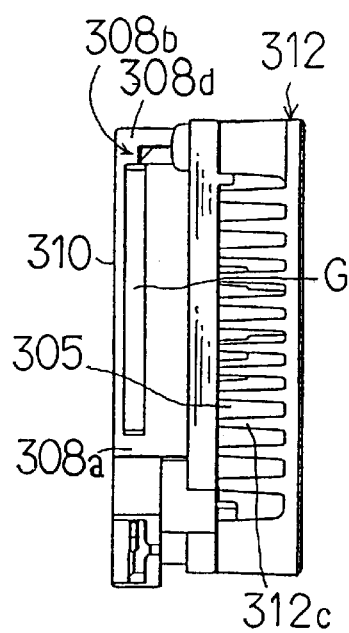
Figure 14C:
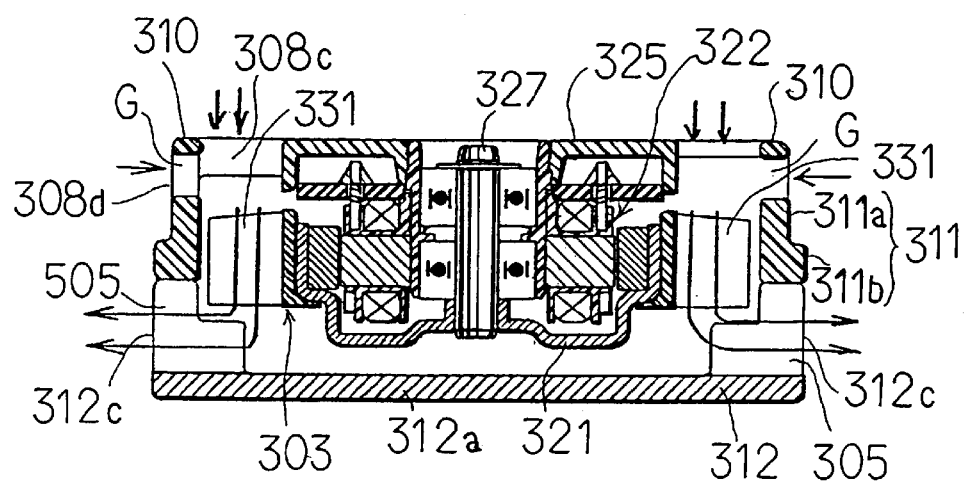

Referring now to FIGS. 14A to 14C, another embodiment of the present invention is illustrated. Parts in the illustrated embodiment similar to those in the embodiment of FIGS. 9 to 11 are designated at reference characters represented by adding numeral "100" to reference characters used for indicating the corresponding parts in the apparatus shown in FIG. 12. In an electronic component cooling apparatus of the illustrated modification, four lateral discharge ports 305 are arranged so as to face four sides of a heat sink, respectively. In the illustrated embodiment, a first casing half 311 and a heat sink 312 constituting a second casing half are formed into an outer configuration of a substantially square in plan. The illustrated embodiment is constructed so as to be different from the apparatus of FIGS. 9 to 13 in that leg sections 308d of three webs 308a to 308c constituting a spacer means are connected to each other through reinforcing connection elements 310 of an arcuate shape. Such construction permits a cylindrical wall 311b to be formed with three windows extending in a circumferential direction. The windows thus formed exhibit the same function as the gap G shown in each of FIGS. 9 and 12. Also, the illustrated embodiment reinforces mechanical strength of the first casing half 311.

Figure 15:
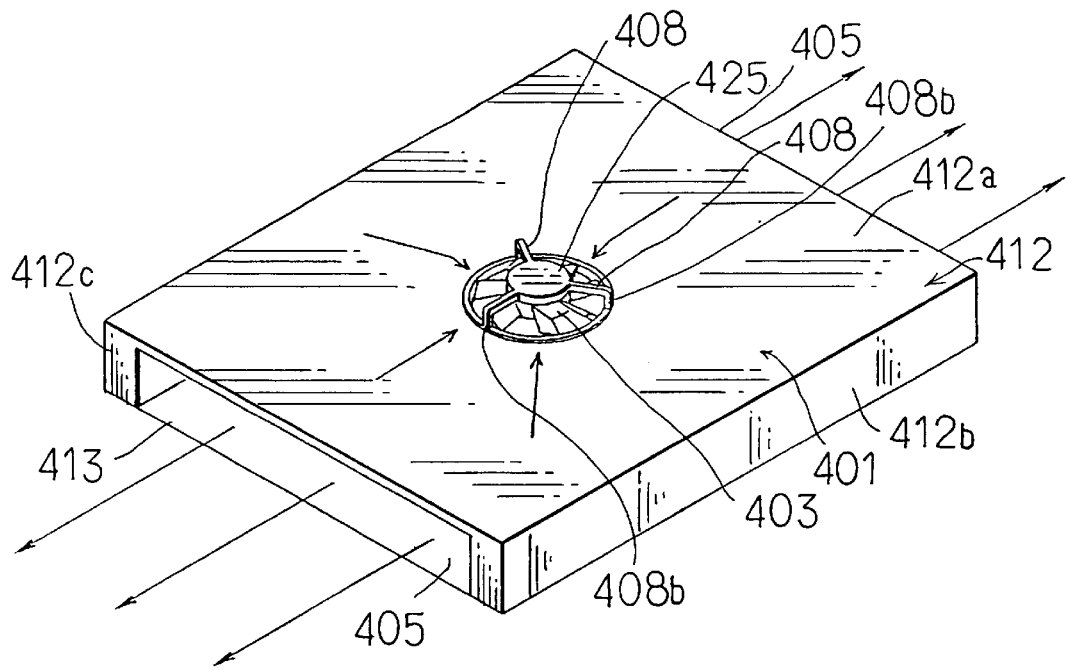
FIG. 15 is a perspective view showing yet another embodiment of an electronic component cooling apparatus according to the present invention.
Figure 16:
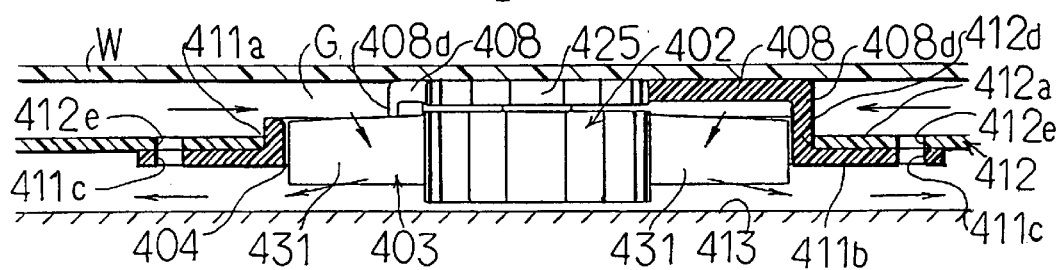
FIG. 16 is a sectional view showing an essential part of the electronic component cooling apparatus of FIG. 15 which is arranged in an electronic appliance.

Referring now to FIG. 15, a still further embodiment of an electronic component cooling apparatus according to the present invention is illustrated. FIG. 16 shows arrangement of the cooling apparatus of FIG. 15 in an electronic appliance. A cooling apparatus of the illustrated embodiment is adapted to cool an electronic component having an increased heat-generating area such as a plasma display device. Thus, the apparatus of the illustrated embodiment is so constructed that a cooled wall (a wall to be cooled) or a heat generating portion 413 of an electronic component constitutes a part of a casing 401. More specifically, the casing 401 includes a second wall arranged opposite to an impeller 403 and acting to prevent air introduced into a cavity 404 from one side thereof in an axial direction thereof from flowing toward the other side thereof. The second wall is constituted by the cooled wall or heat generating portion 413 of the electronic component. The air thus introduced is caused to flow along the cooled wall 413 of the electronic component.

Also, the casing 401 includes a first casing section 411 and a second casing section 412. The first casing section 411 includes a cylindrical wall 411a which provides a surrounding portion for surrounding a whole circumference of a half portion of the impeller defined on one side in axial direction thereof and a flange section 411b arranged so as to radially extend from a proximal portion of the cylindrical wall 411a. The flange 411b is formed into a rectangular outer configuration. The flange 411b is formed at each of corners thereof with a thought-hole 411c for mounting. A motor 402 includes a housing 425 which is connected to an end of the cylindrical wall 411a defined on the one side of the axial direction by means of three webs 408. In the illustrated embodiment as well, the webs 408 include leg sections 408d, which are arranged so as to extend from the end of the cylindrical wall 411a toward the one side to constitute a spacer means for providing a space G which permits air to be suckedly introduced therethrough into the cavity 404 in a radial direction of a revolving shaft. The second casing section 412 includes a flat plate 412a of a rectangular shape constituting a third wall substantially facing the second wall or cooled wall 413 at a predetermined interval and a pair of side walls 412b and 412c arranged on two long sides of the flat plate 412a so as to extend toward the cooled wall 413. The flat plate 412a, as shown in FIG. 16, is formed at a substantially central portion thereof with a through-hole 412d in which the cylindrical wall 411a of the first casing section 411 is fitted. Also, as shown in FIG. 15, the flat plate 412a is provided with four mounting through-holes 412e adapted to be aligned with the through-holes 411c of the flange 411b of the first casing section 411. The first casing section 411 and second casing section 412 are securely joined to each other by means of screws threadedly inserted into the through-holes 411c and 412e.

In the illustrated embodiment, as shown in FIG. 15, the second casing section 412 is provided at each of both ends thereof defined in a longitudinal direction thereof with a discharge port 405. Thus, when the cooling apparatus of the illustrated embodiment is mounted in a receiving housing of an electronic appliance while using the cooled wall 413 as a part of the casing and an opposite member W such as the receiving housing, a circuit board or the like is arranged in proximity to the housing member 425 of the motor 402 as shown in FIG. 15, the space G having a height corresponding to a length of the legs 408d of the webs 408 is defined on a suction side of the casing. In the illustrated embodiment as well, the length of the legs 408d of the webs 408 and a dimension of projection of the housing member 425 are determined so that a suction pressure sufficient to permit air to be suckedly introduced into the cavity 404 may be established in the space G defined by the legs 408d or a pressure difference sufficient for suckedly introducing air into the cavity may occur in the space G. This results in air being suckedly introduced into the cavity 404 through a passage defined between the opposite member W and the third wall or flat plate 412a and then discharged through a passage between the flat plate 412a and the second wall or cooled wall 413 from the two discharge ports 405.

Figure 17:
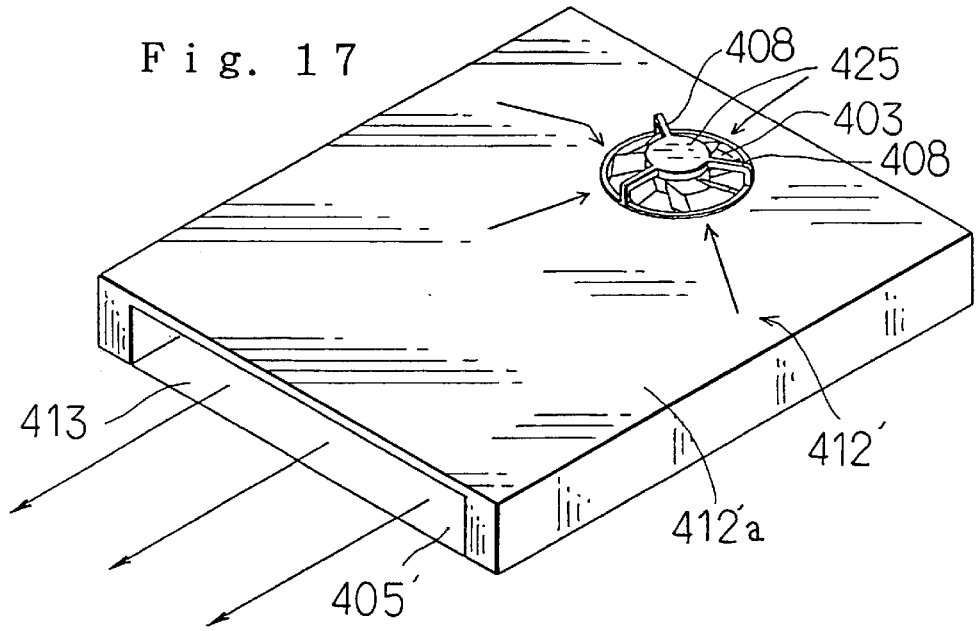
FIG. 17 is a perspective view showing a still further embodiment of an electronic component cooling apparatus according to the present invention.

Thus, the illustrated embodiment permits the single cooling apparatus or air fan to flow air along the cooled wall of an increased area. The cooling apparatus of FIG. 15 is provided with two such discharge ports 405. Alternatively, it may be constructed as shown in FIG. 17, wherein a second casing 412' is provided at only one end thereof in a longitudinal direction thereof with a discharge port 405'. In this instance, the cooling apparatus is arranged in proximity to an end of the cooled wall opposite to the discharge port 405'. This results in air sucked by the impeller 403 flowing on a whole surface of the cooled wall 413 in spite of the single discharge port 405'.

In the illustrated embodiment, the opposite member W is kept contacted with the housing member 425 of the motor 403 and the webs 408. Alternatively, when a sufficient space is ensured, a space may be provided between the opposite member and the housing 425 or webs 408. In the illustrated embodiment, the second casing section provides a duct structure.

Figure 18:
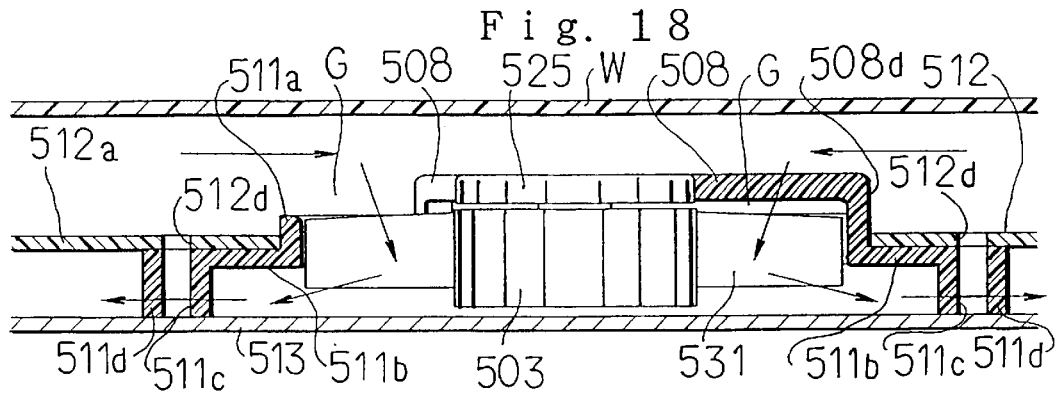
FIG. 18 is a sectional view showing a modification of the electronic component cooling apparatus shown in each of FIGS. 15 and 17.

Referring now to FIG. 18, a modification of the cooling apparatus shown in each of FIGS. 15 and 17 is illustrated. A cooling apparatus of the modification is so constructed that a flange 511b of a first casing section 511 is integrally mounted on each of four corners thereof with a pillar 511d of a cylindrical shape. The remaining part of the modification may be constructed in substantially the same manner as the apparatus shown in FIG. 15 or 17. The pillars 511d each are formed with a through-hole 511c. Correspondingly, a second casing section 512 is formed with four through-holes 512d, so that the first casing section 511 and second casing section 512 are securely joined to each other by means of screws threadedly inserted into the through-holes 511d and 512d. In the modification, four such pillars 511d act as a spacer means for defining a space between a cooled wall 513 and a third wall or flat plate 512a, to thereby prevent an impeller 503 from being contacted with the cooled wall 513 because the flat plate 512 is bent when an opposite member W is pressedly forced against a housing member 525 of a motor 502 or webs 506.

Figure 19:
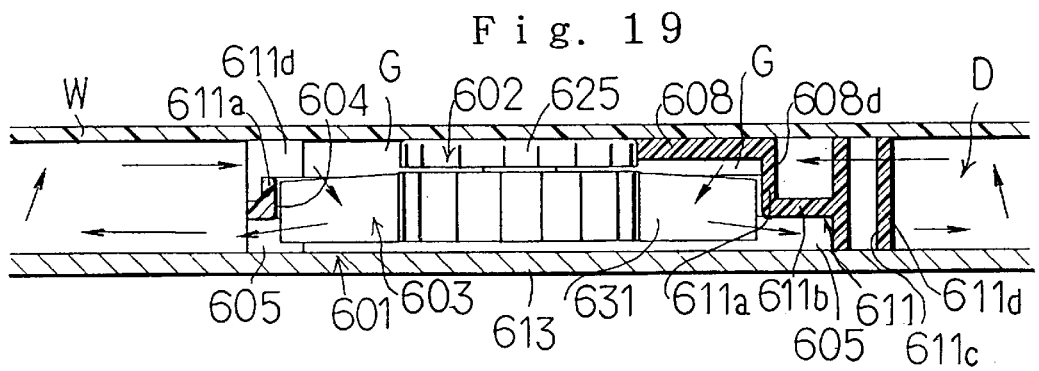
FIG. 19 is a sectional view showing a yet further embodiment of an electronic component cooling apparatus according to the present invention.
Figure 20:
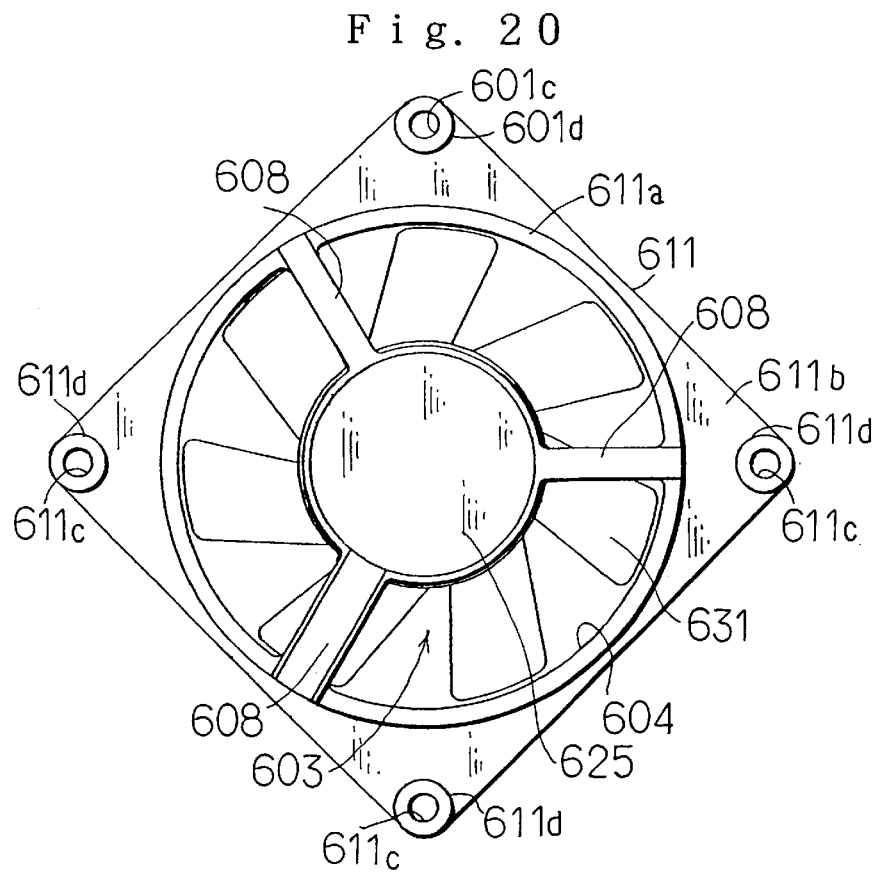
FIG. 20 is a plan view showing a fan unit used in the electronic component cooling apparatus of FIG. 18.

Referring now to FIGS. 19 and 20, a yet further embodiment of an electronic component cooling apparatus according to the present invention is illustrated, which is constructed in such a manner that a second wall of a casing 601 is constituted by a cooled wall 613 of an electronic appliance as in the cooling apparatuses shown in FIGS. 15 to 18. However, parts which corresponds to the second casing section 412 or 512 in the cooling apparatus of FIGS. 15 to 18 are eliminated from the illustrated embodiment. The cooling apparatus of the illustrated embodiment is so constructed that air is agitated in a duct D formed between an opposite wall W and a cooled wall 613. The casing 601 includes a casing section 611 and a part of a cooled wall 613. The casing section 611 includes a cylindrical wall 611a constituting a first wall or a surrounding portion for surrounding a whole circumference of a half section of an impeller 603 on one side in an axial direction thereof, a flange 611b of a rectangular outer configuration, and four pillars 611d integrally provided on four corners of the flange 611b and each formed with a through-hole 611c. Also, the impeller 603 is formed on a lower half section thereof with a discharge port 605 so as to extend over an angular range of 360 degrees or over a whole circumference thereof. A dimension of the cylindrical wall 611a in an axial direction thereof is determined so as to effectively prevent air circulation which causes a large amount of air discharged from the discharge port 605 to be suckedly returned through an open end of a cavity 604 on a suction side to the cavity 604 immediately after the discharge. Thus, as indicated at arrows in FIG. 19, air discharged from the discharge port 605 is caused to flow along the cooled wall 613 in the duct D to a certain degree and be then suckedly returned to the cavity 604, resulting in being significantly circulated in the duct D. Mounting of the opposite member W and casing section 611 is carried out through the pillars 611d, which also function as a spacer means for forming a space G between the cooled wall 613 and the opposite wall W. In the illustrated embodiment, the spacer means is constituted by the pillars 611d and the legs 608d of the webs 608, so that air may be suckedly introduced through the space G into the cavity 604 in a radial direction of a revolving shaft.

In each of the embodiments described above, the spacer means is constituted by the legs of the webs, the housing member of the motor, the pillars provided on the casing or the like. Alternatively, a projection means may be provided on the webs and the housing member of the motor so as to act as the spacer means in cooperation with or in place of the legs, housing member or pillars. Such construction likewise provides a space through which air is suckedly introduced into the cavity even when the webs and the housing of the motor are arranged so as to be flush with an end surface of the cylindrical wall.

As can be seen for the foregoing, the electronic component cooling apparatus of the present invention significantly increases the amount of air fed as compared with the conventional cooling apparatus using the radial fan. Also, the apparatus of the present invention ensures satisfactory feeding of air even when it is received in a receiving housing of an electronic appliance reduced in thickness or depth.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising;

a motor including a rotor and a stator;

an impeller securely mounted on said rotor and including a plurality of blades for drawing air from one side in an axial direction of a revolving shaft of said motor;

a casing defining a cavity in which said motor and said impeller are received, said casing being formed with an open end of said cavity defined at said one side of said axial direction and a discharge port for discharging air in only one direction perpendicular to said axial direction, said casing being constructed of a first casing section including the open end and a second casing section being constituted by a heat sink;

said heat sink having a base formed into a substantially rectangular outer configuration with four corners and having a plurality of radiation fins arranged thereon, at least some of said plurality of radiation fins being arranged in proximity to said discharge port; and, a center of said impeller being spaced from a center of said heat sink toward one corner of said four corners of said heat sink, said one corner being one of two corners positioned opposite to said discharge port and being located in a direction opposite to a direction of rotation of the impeller.

2. An electronic component cooling apparatus as defined in claim 1, wherein said heat sink is formed with a rib on said base thereof, said rib being provided on an outer periphery of said base other than a portion thereof facing said discharge port in a manner to surround said impeller;

said rib supporting said first casing section thereon; and, some of said plurality of radiation fins being formed into a configuration which permits air discharged from said impeller to flow along an inner surface of said rib.

3. An electronic- component cooling apparatus as defined in claim 2, wherein said plurality of radiation fins arranged in proximity to said discharge port being formed so as to extend along a stream of air discharged from said impeller.

4. An electronic component cooling apparatus as defined in claim 1, wherein said first casing section has a housing member of said motor supported thereon through a plurality of webs, said webs being spaced from each other at intervals in a circumferential direction of said first casing section; and, a plurality of legs of said webs forming a spacer means arranged so as to outwardly project on said side to provide a space through which air is drawn into said cavity in a radial direction of said revolving shaft.

5. An electronic component cooling apparatus as defined in claim 4, wherein said spacer means is formed into a length in said axial direction which establishes a suction pressure sufficient to permit a suitable amount of air to be drawn into said cavity when an opposite member is arranged on said cavity.

* * * * *

UNITED STATES PATENT AND TRADEMARK OFFICE
CERTIFICATE OF CORRECTION

PATENT NO. : 5,910,694
DATED : June 8, 1999
INVENTOR(S) : Yokozawa et al.

It is certified that error appears in the above-identified patent and that said Letters Patent is hereby corrected as shown below:

On the Title Page, Section [56], References Cited,
U.S. PATENT DOCUMENTS, first reference, delete
"8/1979" and insert --8/1997--.

Column 2, Line 32, delete "sides" and insert --side--.

Column 6, Line 30, delete "cup-lie" and insert --cup-like--.

Signed and Sealed this

Ninth Day of November, 1999

Attest:

Attesting Officer

Q. TODD DICKINSON

Acting Commissioner of Patents and Trademarks